US012666736B2

(12) United States Patent
Kruschwitz et al.

(10) Patent No.: US 12,666,736 B2
(45) Date of Patent: Jun. 23, 2026

(54) MULTISPECTRAL IMAGING CMOS SENSOR

(71) Applicant: University of Rochester, Rochester, NY (US)

(72) Inventors: Jennifer Kruschwitz, Rochester, NY (US); Jaime Cardenas, Rochester, NY (US)

(73) Assignee: University of Rochester, Rochester, NY (US)

( * ) Notice: Subject to any disclaimer, the term of this patent is extended or adjusted under 35 U.S.C. 154(b) by 625 days.

(21) Appl. No.: 17/987,981

(22) Filed: Nov. 16, 2022

(65) Prior Publication Data

US 2023/0083948 A1 Mar. 16, 2023

Related U.S. Application Data

(63) Continuation of application No. PCT/US2021/031051, filed on May 6, 2021.

(60) Provisional application No. 63/026,224, filed on May 18, 2020.

(51) Int. Cl.
H10F 39/00 (2025.01)
H10F 39/18 (2025.01)

(52) U.S. Cl.
CPC ....... H10F 39/8053 (2025.01); H10F 39/014 (2025.01); H10F 39/182 (2025.01)

(58) Field of Classification Search
CPC .. H10F 39/8053; H10F 39/014; H10F 39/182; H10F 39/18; H10F 39/12; H10F 39/191; H10F 39/192; H10F 77/40; H10F 39/806; H10F 39/80; H10D 84/891; H10D 44/40; G02B 5/223
See application file for complete search history.

(56) References Cited

U.S. PATENT DOCUMENTS

| | | | |
|---|---|---|---|
| 5,278,590 A | 1/1994 | Phillips | |
| 6,602,608 B2 | 8/2003 | Stachowiak | |
| 2009/0302407 A1 | 12/2009 | Gidon | |
| 2010/0148291 A1* | 6/2010 | Tivarus | H10F 39/199 |
| | | | 257/E31.127 |
| 2016/0033328 A1 | 2/2016 | Walters | |
| 2016/0211388 A1 | 7/2016 | Natsuaki | |
| 2018/0335557 A1* | 11/2018 | Ockenfuss | G02B 5/288 |
| 2020/0064195 A1* | 2/2020 | Gallinet | G01J 3/1895 |

(Continued)

FOREIGN PATENT DOCUMENTS

| | | |
|---|---|---|
| EP | 472371 | 10/1998 |
| EP | 2428993 | 9/2015 |

(Continued)

OTHER PUBLICATIONS

Japanese Office Action for Application No. 2022-570317, dated Jan. 7, 2025.

(Continued)

*Primary Examiner* — Jessica S Manno
*Assistant Examiner* — Sandra Milena Rodriguez Villanueva
(74) *Attorney, Agent, or Firm* — Wissing Miller LLP

(57) ABSTRACT

Multipixel sensors using color filters formed of materials compatible with a CMOS process, where the filters have respective bandpass ranges of no more than 40 nm FWHM centered at respective wavelengths in the 400-900 nm range and 50% or more light transmission on a silicon wafer.

8 Claims, 5 Drawing Sheets

(56) References Cited

U.S. PATENT DOCUMENTS

| | | | |
|---|---|---|---|
| 2020/0109991 A1 | 4/2020 | Tack | |
| 2020/0408598 A1 | 12/2020 | Toda | |

FOREIGN PATENT DOCUMENTS

| | | | |
|---|---|---|---|
| EP | 3557625 | | 10/2019 |
| EP | 3633334 | | 4/2020 |
| JP | 2009545150 | | 12/2009 |
| JP | 2012059865 | | 3/2012 |
| JP | 5332996 | B2 * | 11/2013 |
| JP | 2018098344 | | 6/2018 |
| JP | 2018200464 | | 12/2018 |
| JP | 2019145563 | | 8/2019 |
| JP | 2020034899 | | 3/2020 |
| WO | 2014143235 | | 9/2014 |
| WO | 2015025637 | | 2/2015 |

OTHER PUBLICATIONS

Alfred Thelen, Equivalent Layers in Multilayer Filters, Journal of the Optical Society of America, Optical Coating Laboratory, Inc., Santa Rosa, California 95401, vol. 56, No. 11, Nov. 1, 1966, pp. 1534-1538.

L. I. Epstein "The Design of Optical Filters", JOSA, 42, pp. 806-810 (1952).

A. Thelen, Design of Optical Interference Coatings, Chapter 3.1, McGraw-Hill New York (1989).

A. Thelen, M. Tilsch, A. Tikhonravov, M. Trubetskov, U Brauneck, "Topical Meeting on Optical Interference Coatings (OIC 2001): design contest results," Appl. Opt. 41, pp. 3022-3038 (2002).

J. D. T. Kruschwitz, R. S. Berns, "Nonpolarizing color mirrors on a high reflecting base," Appl. Opt. 53, pp. 3448-3453 (2014).

J. A. Dobrowolski, Li Li, R. A. Kemp, "Metal/dielectric transmission interference filters with low reflectance. 1. Design," Appl. Opt. 34, pp. 5673-5683 (1995).

S. A. Maier, Plasmonics: Fundamentals and Applications, Chapter 8, Springer Science and Business Media (2010).

Q. Chen and D. R. S. Cummings, "High transmission and low color crosstalk plasmonic color filters using triangular-lattice hole arrays in aluminum films," Opt. Express, 18, pp. 14056-14062 (2010).

J. M. Rabaey, A. P. Chandrakasan, and B. Nikolic, Digital Integrated Circuits: A Design Perspective, 2nd ed., Prentice Hall Electronics and VLSI Series, Upper Saddle River, NJ: Pearson Education, 2003.

* cited by examiner

10

1. BACK-SIDE ILLUMINATION

MICROLENS
COLOUR FILTER 14
PHOTODIODE 12
SUBSTRATE
METAL WIRING

2. FRONT-SIDE ILLUMINATION

MICROLENS
COLOUR FILTER
METAL WIRING
PHOTODIODE
SUBSTRATE

HORIZONTAL, VERTICAL, OR RADIAL E1 STACKS

E1 STACK EXAMPLE

200nm DIELECTRIC FILM S1O2/T1O2/S1O2

CAVITY DESIGNS

CAVITY FILTER EXAMPLE

SILVER CAVITY FILTER EXAMPLE

MULTISPECTRAL FILTER EXAMPLE

MULTISPECTRAL IMAGING CMOS SENSOR

REFERENCE TO RELATED APPLICATIONS

This application is a continuation-in-part of PCT Application No. PCT/US2021/031051 filed on May 6, 2021, claims priority to the PCT Application which in turn claims priority to U.S. Provisional patent application 63/026,224 filed May 18, 2020, and incorporates by reference the contents or each of said patent applications.

FIELD

This patent specification is in the field of color filters for image sensors such as multipixel CMOS sensors.

BACKGROUND

Multipixel image sensors are widely used in digital cameras, LIDAR, medical imaging devices, and other equipment. A typically rectangular array of pixel positions views a scene and the outputs of light sensing devices such as photodiodes at each pixel position convert the scene into electrical signals that are then processed into an electronic image of the scene. In recent years, CMOS (complementary metal oxide semiconductor) image sensors have become predominant although earlier-developed CCD (charge-coupled-device) image sensors are still used where some of their properties are preferred.

For color image sensors, typically arrays of pixel elements are used for each pixel position. Light reaches each pixel element through a respective color filter, so each pixel element responds primarily to a single color, for example red, green, or blue. The electrical outputs of the individual pixel elements for each pixel positions are processed into a color image. Spatial resolution of such sensors has improved over the years to make it practical to pack millions of pixel positions in a single sensor, with pitch from several microns (micrometers) down to less than a micron. The size of the individual color filters needs to be reduced accordingly. Such image sensors can be back-illuminated, which means that light reaches their photodiodes after passing only through a lens and color filter, or front-illuminated so the light passes through metal wiring layers before reaching the photodiodes. CMOS image sensors typically are fabricated on 300 mm or 200 mm wafers diced for subsequent processing.

Pixel elements and thus color filters can be in a pattern of repeated rectangular arrays of four elements each for each pixel position, for example as a Bayer filter composed of repeated arrays each made up of four filters—one red (R), one blue (B), and two green (G). Many other filters are known, for example RGBE, RYYB, CYYM, and CYGM filters, to name a few. Traditionally, such color filters rely on pigments or dyes and can be formed on a separate substrate later affixed to the image sensor or can be patterned directly on the surface of the image sensor (on-chip). FIG. 1a is a perspective view illustrating a portion of an image sensor with a Bayer filter. FIG. 1b is a sectional view illustrating a configuration of a lens, color filter, photodiode, metal wiring and substrate of a typical back-illuminated image sensor, and FIG. 1c illustrates a configuration of like components of a front-illuminated image sensor. Multispectral imaging is a variation that involves not only spatial but also spectral imaging and may use more than four photodiodes per pixel position.

SUMMARY OF THE DISCLOSURE

According to some embodiments, a multipixel image sensor comprises: an array of photodiodes formed in a front-end CMOS process; a respective color filter over each of said photodiodes, each color filter formed of materials compatible with said front-end CMOS process; wherein each of said color filters has a selected bandpass range of no more than 40 nanometers Full-Width-Half-Maximum centered in a wavelength in the range of 400 to 900 nanometers and 50% or more light transmission on a silicon waver; and wherein some of said color filters have a first bandpass range, some have a second bandpass range different from the first bandpass range, and some have a third bandpass range different from the first and second bandpass ranges. The sensor can include one or more of the following additional features: the filters can be arranged in a laterally extending array of uniform thickness; each color filter can comprise a first material having a first refractive index surrounded by materials having a second refractive index different from the first refractive index, wherein the combined refractive index of said materials differs from the first and second refractive indices and matches a respective one or said bandpass ranges; the color filters can be equivalent index filters, or multicavity filters.

According to some embodiments, a method of fabricating a multipixel image sensor comprises: forming an array of photodiodes in a front-end CMOS process; forming a respective color filter over each of said photodiodes, each color filter formed of materials compatible with said front-end CMOS process; wherein each of said color filters has a selected bandpass range of no more than 40 nanometers Full-Width-Half-Maximum centered in a wavelength in the range of 400 to 900 nanometers and 50% or more light transmission on a silicon waver; and wherein some of said color filters have a first bandpass range, some have a second bandpass range different from the first bandpass range, and some have a third bandpass range different from the first and second bandpass ranges. The method can include one or more of the following additional features: the step of forming the array of filters can comprise arranging the filters in a laterally extending array of uniform thickness; the step of forming the filters can comprise forming each filter of a first material having a first refractive index surrounded by materials having a second refractive index different from the first refractive index, wherein the combined refractive index of said materials differs from the first and second refractive indices and matches a respective one or said bandpass ranges; and the step of forming said color filters can comprise forming equivalent index filters or multicavity filters.

DETAILED DESCRIPTION OF EXAMPLES

A detailed description of examples of preferred embodiments is provided below. While several embodiments are described, the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all these details. Moreover, for the purpose of clarity, certain technical material that is known in the related art has not been described in detail in order to avoid unnecessarily obscuring the new subject matter described herein. Individual features of one or several of the specific embodiments described herein can be used in combination with features of other described embodiments or with other features. Further, like reference numbers and designations in the various drawings indicate like elements.

Figure 1A:
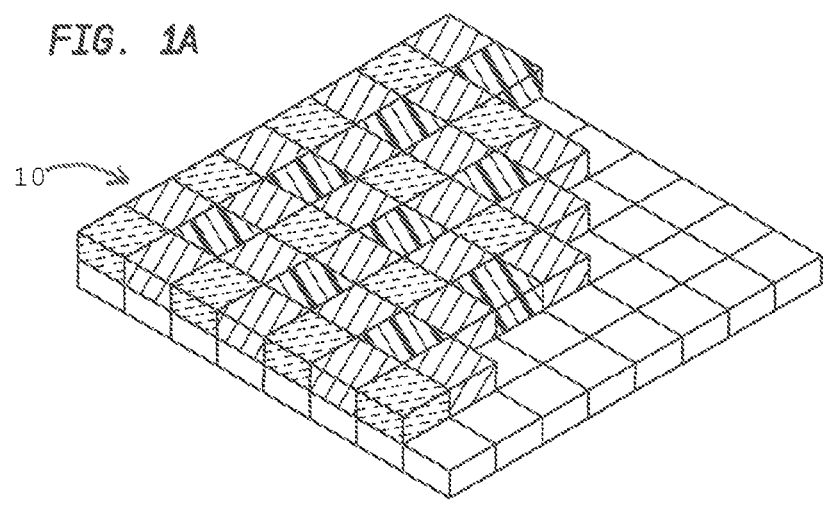
FIG. 1a is a perspective view of a portion of an image sensor with a Bayer filter.
Figure 1B:
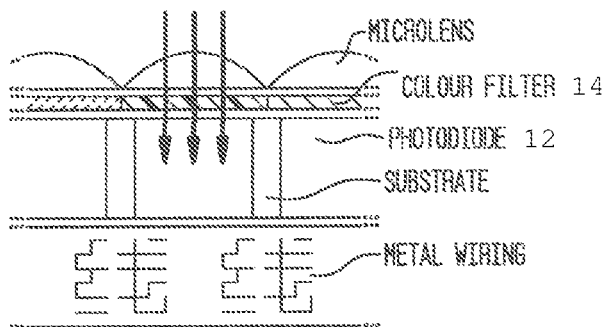
FIG. 1b is a sectional view illustrating a configuration of a lens, color filter; photodiode, metal wiring and substrate of a typical back-illuminated image sensor, according to some embodiments.
Figure 1C:
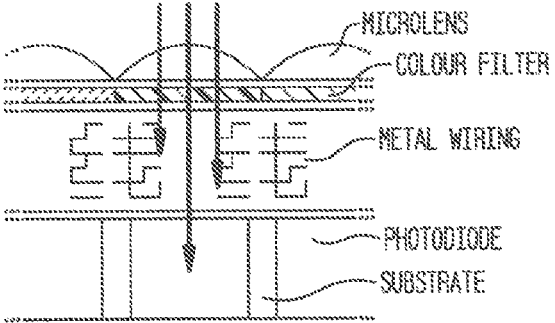
FIG. 1c illustrates a configuration of like components of a front-illuminated image sensor, according to some embodiments.

Using pigments of dyes for the color filters illustrated in FIGS. 1a-1c according to conventional technologies entails shortcomings such as limitations in achievable optical properties such as a narrow enough bandpass of light wavelengths, desired transmission characteristics, and other optical parameters. Another important challenge with such filters is difficulties in achieving a uniform thickness of the different color filters. Yet another is that forming them does not integrate well in typical CMOS chip fabrication processes.

This patent specification describes technologies designed to replace pigment or dye color filters with filters that have improved optical and other properties and better match a fabrication process such as a CMOS process. The new technologies include (1) Equivalent Index of metals and dielectrics filters, (2) multi-cavity filters, and (3) inverse design modeling filters. An objective is to create filters such as narrow bandpass filters (e.g., <40 nm Full-Width-Half-Maximum), across a wavelength range of e.g. 400-900 nm, that have high transmission, e.g., 2: 50%, on a silicon wafer.

The patent specification cites several publications at the end of the Detailed Description and refers to them below by numerals in square brackets. Each is hereby incorporated by reference.

Figure 2:
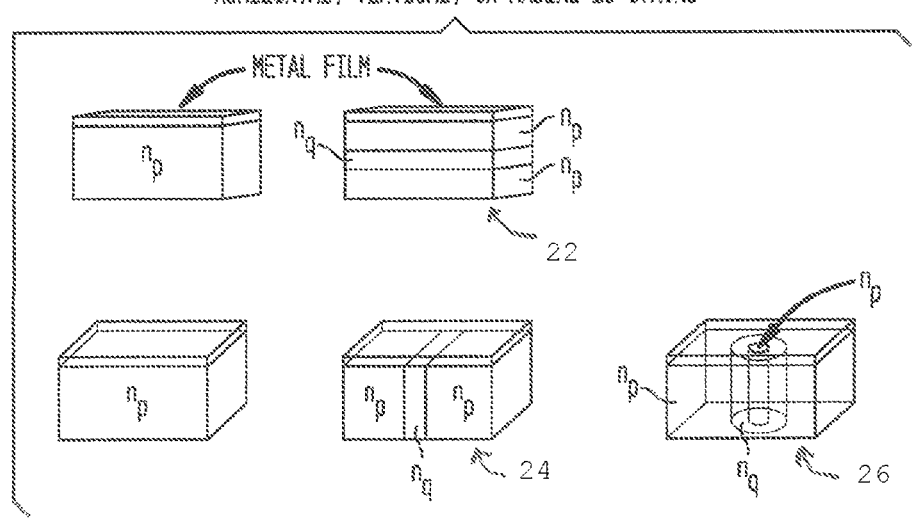
FIG. 2 illustrates horizontal, vertical, and radial equivalent index stacks for color filters, according to some embodiments.

According to some embodiments, color filter designs make use of equivalent index (EI) structures of metals and dielectrics. Herpin equivalent index [1] in optical interference coating involves using two different refractive index dielectric materials (np and nq) in a three-layer series to simulate a third refractive index at a given wavelength. The symmetric series of layers can be ordered np/nq/np or nq/np/nq. The different physical thickness and optical properties of the two outside layers or regions versus the inside layer or region allows the designer to mimic a very high or very low refractive index at a single wavelength or a narrow range of wavelengths. More layers can be used, in a symmetric stack of plural sets of three layers each, to produce a unique refractive index at a desired wavelength [2]. FIG. 2 illustrates several EI configurations using two different materials np and nq in three possible arrangements: (1) a vertical stack of a horizontal middle layer or region of material nq and horizontal top and top and bottom layers or regions of np material, (2) a horizontal stack of a vertical central column of material np surrounded by a tube of material nq that in turn is surrounded by material np, and (3) a horizontal stack of materials np and nq. In each case, the stack can be topped with a metal layer as illustrated.

In a nonlimiting example of EI designs, a simple aluminum plasmonic layer is formed on $SiO_2$ and the $SiO_2$ layer is divided in half horizontally by another refractive index oxide material or possibly thin metal film to form a structure illustrated in FIG. 2 (horizontal EI stack 22) [9, 10]. Changing the EI of that base $SiO_2$ layer can alter the performance of the plasmonic filter to facilitate selection of a configuration suitable for a specific application. Vertical and radial distributed EI 24 and 26 of the $SiO_2$ layer can be formed likewise and like changes of the base $SiO_2$ layer can alters the performance of the plasmonic filter and facilitate selection of a configuration suitable for a specific application. An important benefit of this type color filter in many fabrication processes is that utilizing EI can maintain a constant physical thickness throughout the filter array. EI can produce a gradual and purposeful change in refractive index while maintaining the physical thickness of the entire color filter system.

Figure 3:
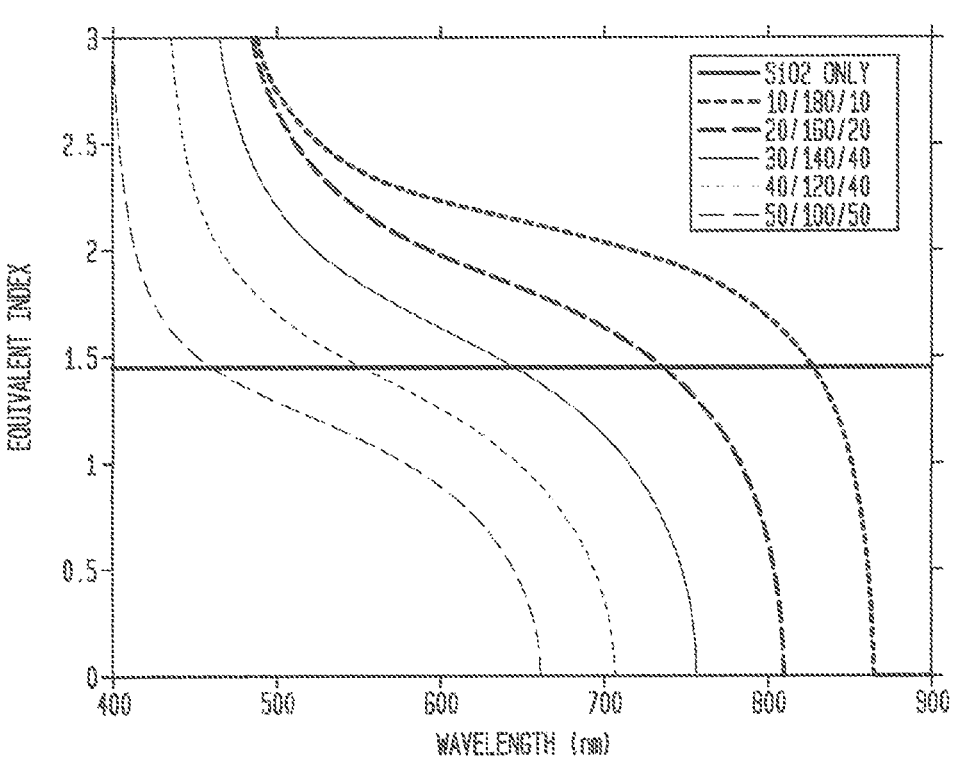
FIG. 3 illustrates plots of equivalent index vs. wavelength for three-region EI filter with different thicknesses of layers, according to some embodiments.

FIG. 3 illustrates an example of EI color filter configurations of three materials, a layer or region of $SiO_2$ between two layers or regions of $TiO_2$, according to some embodiments. The plots in FIG. 3 illustrate the equivalent index of a 200 nm film. The solid thin line represents the refractive index of a continuous $SiO_2$ film. Each additional line represents inserting various thicknesses of a $TiO_2$ film ($n_q$) horizontally in the $SiO_2$ film ($n_p$) while maintaining a total physical thickness of 200 nm. The plots indicate that the combination of refractive indices can replicate the refractive index of $SiO_2$ at different wavelengths while maintaining the same physical thickness. Expressions 1-3 below generalize these relationships:

$$\begin{bmatrix} M_{11} & M_{12} \\ M_{21} & M_{22} \end{bmatrix} = \tag{1}$$

$$\begin{bmatrix} \cos\varphi_p & \dfrac{i\sin\varphi_p}{n_p} \\ in_p\sin\varphi_p & \cos\varphi_p \end{bmatrix} \begin{bmatrix} \cos\varphi_q & \dfrac{i\sin\varphi_q}{n_q} \\ in_q\sin\varphi_q & \cos\varphi_q \end{bmatrix} \begin{bmatrix} \cos\varphi_p & \dfrac{i\sin\varphi_p}{n_p} \\ in_p\sin\varphi_p & \cos\varphi_p \end{bmatrix}$$

$$\varphi_{p,q} = \frac{2\pi n_{p,q} d_{p,q}}{\lambda} \tag{2}$$

$$EI = +\sqrt{\frac{M_{21}}{M_{12}}} \tag{3}$$

where M designates an element of a characterization matrix, J designates the phase thickness of the layer in radians determined by the refractive index (n) and the physical thickness of the layer (d), i designates an imaginary part, and p and q are the two materials.

Figure 4:
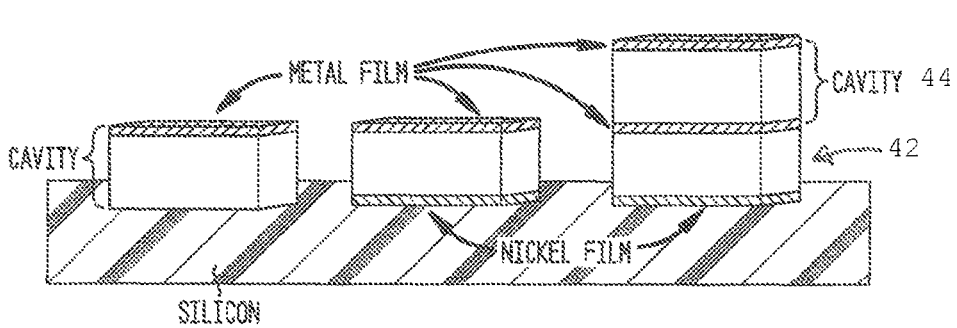
FIG. 4 illustrates cavity designs for color filters, according to some embodiments.

According to some embodiments, multi-cavity color filters are designed. Design strategies for these filters involve forming multilayer dielectric mirrors separated by a thick dielectric spacer that can be called a cavity [3]. A single cavity may produce a wide bandpass filter that has transmission above 80%. Stacking cavities or repeating the mirror/spacer/mirror/ . . . /mirror can produce an extremely narrowband filter. These designs in practice can be hundreds of layers in case of an extremely narrow wavelength transmission requirement. The filter enhancing properties in bandwidth and transmission of a cavity can be leveraged for a plasmonic filter design whereas a single cavity can be considered as a dielectric film sandwiched between a metal film and a silicon wafer, or sandwiched between a metal film and another metal film, such as nickel. FIG. 4 illustrates such cavity designs 42, 44.

Figure 5:
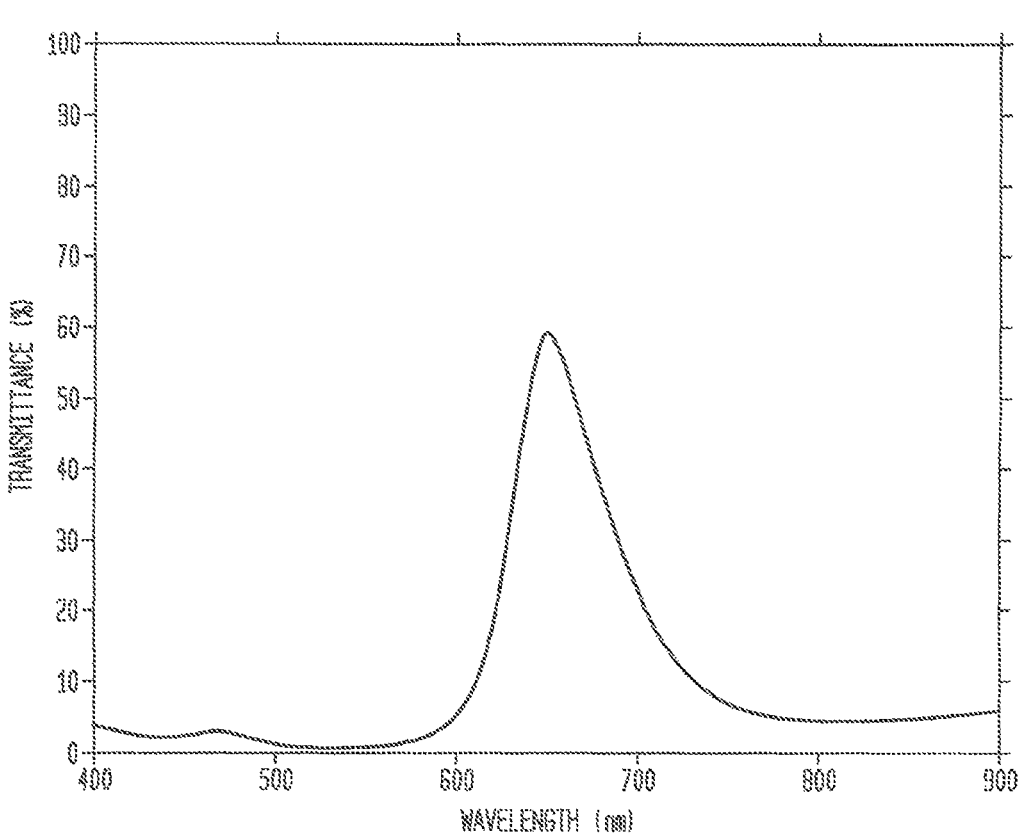
FIG. 5 illustrates performance of a cavity filter example, according to some embodiments.

FIG. 5 illustrates performance of a multicavity color filter formed of a stack of layers of the materials identified in Table 1 below, in the respective indicated layer thickness for each material, according to some embodiments. This eight-layer design utilizes aluminum and nickel solid metal films on a silicon wafer. The design increases the transmittance of a single plasmonic aluminum film cavity and simultaneously reduces the lower wavelength transmitting harmonics producing a more saturated red transmitting color.

TABLE 1

Eight layer red filter on Silicon

| Layer # | Layer Material | Layer Thickness (nm) |
|---------|----------------|----------------------|
| 1 | SiO$_2$ | 94 |
| 2 | TiO$_2$ | 79 |
| 3 | Nickel* | 10 |
| 4 | SiO$_2$ | 204 |
| 5 | Aluminum** | 10 |
| 6 | TiO$_2$ | 95 |
| 7 | SiO$_2$ | 57 |
| 8 | TiO$_2$ | 202 |

*top layer on cavity one
**top layer on cavity two

Cavity structures can be in color filters and color mirrors that resemble certain aspects of anti-counterfeiting designs on paper money [4]. These designs use gray absorbing metal films surrounding a dielectric film spacer layer for chromatic, color-changing versus viewing-angle flakes that are incorporated into paints and deposited onto paper currency. The angle sensitivity of these designs can be minimized with the choice of index of the dielectric spacer layer. The reflecting counterpart has a high reflecting aluminum base and gray metal top layer surrounding the dielectric spacer. A limitation of these single cavity designs is that they have a periodicity of either transmission or reflection at lower wavelengths, much like a Fabry-Perot cavity. It is believed that it is not possible or practicable to isolate a single bandpass or reflecting region at higher wavelengths in the visible range for creating orange and red colors using such known filters or mirrors with a single cavity. Peak suppression for anti-counterfeiting designs of this type can use a second cavity by repeating the dielectric spacer and gray (or absorbing) metal [5, 6]. Gray metals can include, but are not limited to, nickel, chrome, Inconel, and/or platinum. The optical properties of a gray metal are such that the real (n) and imaginary (k) refractive indices are nearly equal at the wavelengths of interest. The second cavity's main purpose is to suppress the lower wavelength transmission or reflection bands, isolating a higher wavelength band. This can help suppress lower wavelength bands that appear when the bandpass or reflection bands are narrow and have high transmission or reflection. Different absorbing metals can be used for the second cavity for peak suppression and possibly enhanced output of the main peak.

According to some embodiments, reverse engineering is used to replicate desirable characteristics of silver-employing color filters, such as narrowband and high transmitting silver filters [8,9], in color filters using only materials compatible with standard CMOS processes [11] such as those currently used by companies including Sony and Samsung to fabricate CMOS image sensors. Silver is not compatible with a CMOS process. Such reverse engineering involves using aluminum and other CMOS compatible metals with dielectric materials in EI structures of the type illustrated in FIGS. 2 and 3.

Figure 6:
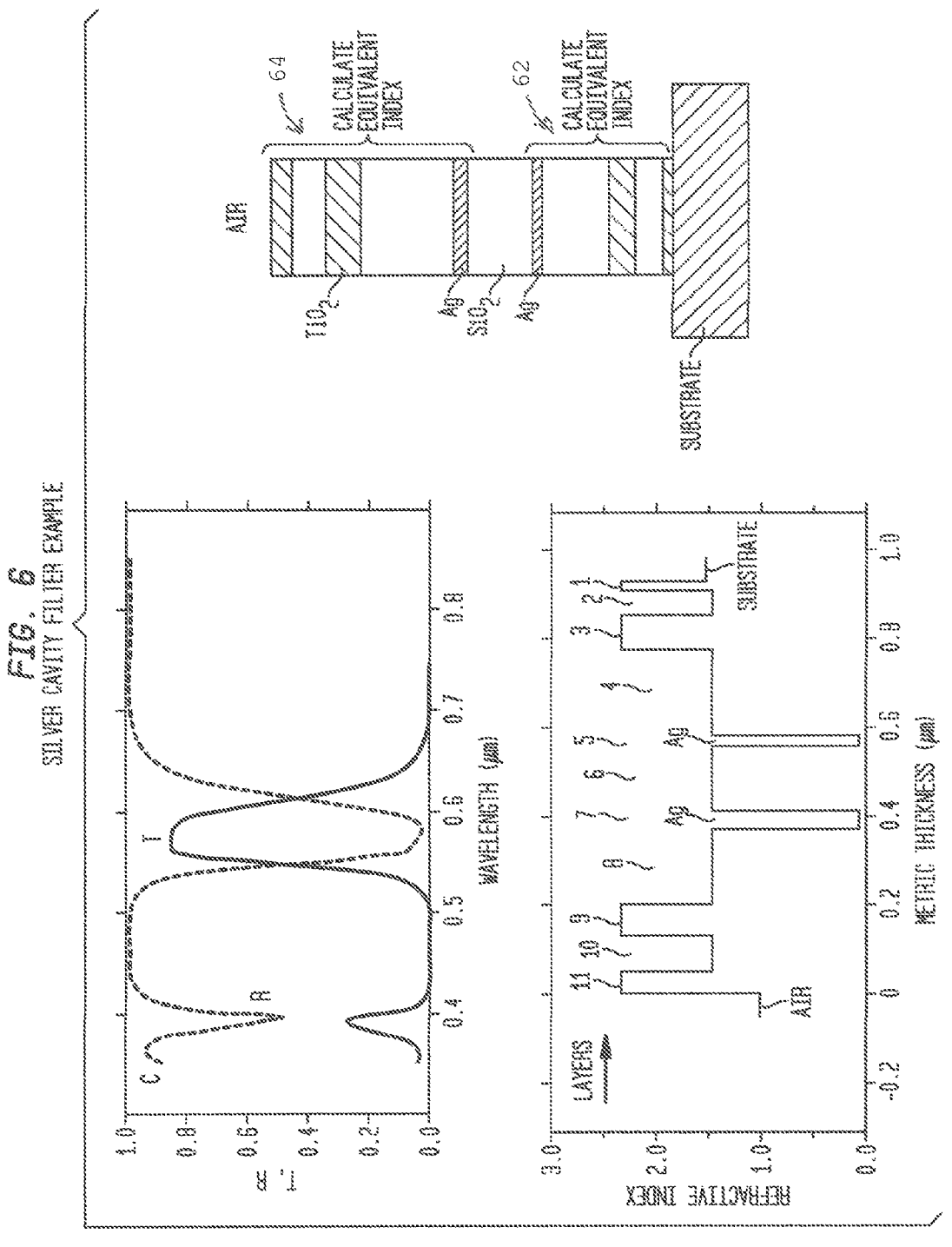
FIG. 6 illustrates a silver cavity filter example useful in reverse engineered color filters using CMOS compatible materials, according to some embodiments.

For example, FIG. 6 illustrates a design and transmittance and reflectance of a multilayer film using two layers of silver [7]. Because silver is not compatible with front-end CMOS processing, the desirable characteristics of such a filter are replicated or reverse-engineered with CMOS-compatible materials according to some embodiments. The righthand side of FIG. 6 is a diagram of how this eleven-layer design can be broken down so that a desired EI can be calculated. Each section 62, 64 of the design contains a silver layer. In order to determine the EI, those proficient in the art of multilayer coating design can utilize a form of the Characteristic Matrix technique outlined in Expressions 1-3 above.

Figure 7:
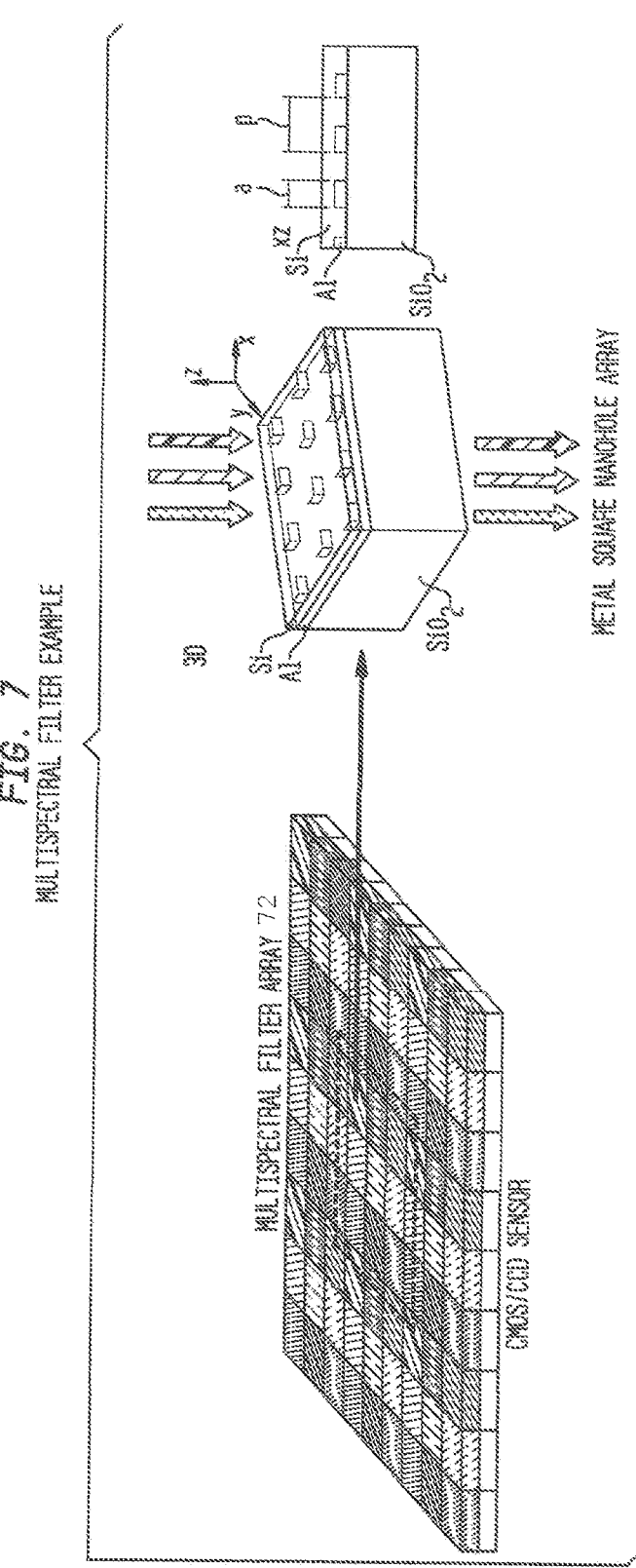
FIG. 7 illustrates a multispectral color filter according to some embodiments.

FIG. 7 illustrates a multispectral color filter 72 according to some embodiments Although the foregoing has been described in some detail for purposes of clarity, it will be apparent that certain changes and modifications may be made without departing from the principles thereof. There can be many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

REFERENCES

1. L. I. Epstein "The Design of Optical Filters" JOSA, 42, pp. 806-810 (1952).
2. A. Thelen, Design of Optical Interference Coatings, Chapter 3.1, McGraw-Hill New York (1989).
3. A. Thelen, M. Tilsch, A. Tikhonravov, M. Trubetskov, U Brauneck, "Topical Meeting on Optical Interference Coatings (OIC 2001): design contest results," Appl. Opt. 41, pp. 3022-3038 (2002).
4. U.S. Pat. No. 5,278,590 (1994), "Transparent Optically Variable Device."
5. EP 0,472,371 B1 (1998), "Optically variable interference device with peak suppression."
6. J. D. T. Kruschwitz, R. S. Berns, "Nonpolarizing color mirrors on a high reflecting base," Appl. Opt. 53, pp. 3448-3453 (2014).
7. J. A. Dobrowolski, Li Li, R. A, Kemp, "Metal/dielectric transmission interference filters with low reflectance, 1. Design," Appl. Opt. 34, pp. 5673-5683 (1995).
8. U.S. Pat. No. 6,602,608 B2, "Coated article with improved barrier layer structure and method of making the same."
9. S. A. Maier, Plasmonics: Fundamentals and Applications, Chapter 8, Springer Science and Business Media (2010).
10. Q. Chen and D. R. S. Cummings, "High transmission and low color cross-talk plasmonic color filters using triangular-lattice hole arrays in aluminum films," Opt. Express, 18, pp. 14056-14062 (2010).

11. J. M. Rabaey, A, P. Chandrakasan, and B. Nikolic, Digital Integrated Circuits: A Design Perspective, 2nd ed., Prentice Hall Electronics and VLSI Series, Upper Saddle River, NJ: Pearson Education, 2003.

The invention claimed is:

1. A multipixel image sensor comprising:

an array of photodiodes formed in a front-end or back-end CMOS process;

a plurality of color filters over each photodiode in the array of photodiodes and arranged in a laterally extending array of uniform thickness;

wherein each of the plurality of color filters being formed of a material that is compatible with the CMOS process;

wherein each of the plurality of color filters has a selected bandpass range of no more than 40 nanometers Full-Width-Half-Maximum centered in a predefined wavelength that is greater than or equal to 400 nanometers and a 50% or more light transmission on a silicon wafer;

wherein at least one of the plurality of color filters has a first bandpass range, at least one of the plurality of color filters has a second bandpass range that is different from the first bandpass range, and at least one of the plurality of color filters has a third bandpass range that is different from the first bandpass range and the second bandpass range; and wherein each of the plurality of color filters includes a first material having a first refractive index (np or nq) surrounded by a second material having a second refractive index (nq or np) that is different from the first refractive index, wherein the combined refractive index of the first and second materials differs from the first and second refractive indices and matches a respective one of the bandpass ranges, and wherein the first material includes a metal material therein.

2. The multipixel image sensor of claim 1, wherein each of the plurality of color filters is an equivalent index filter.

3. The multipixel image sensor of claim 1, wherein each of the plurality of color filters is a multicavity filter.

4. The multipixel image sensor of claim 1, wherein each of the plurality of color filters is a multispectral color filter.

5. A method of fabricating a multipixel image sensor comprising:

forming an array of photodiodes in a front-end or back-end CMOS process;

forming a plurality of color filters over each photodiode in the array of photodiodes and arranged in a laterally extending array of uniform thickness;

wherein each of the plurality of color filters being formed of a material that is compatible with the CMOS process;

wherein each of the plurality of color filters has a selected bandpass range of no more than 40 nanometers Full-Width-Half-Maximum centered in a predefined wavelength that is greater than or equal to 400 nanometers and a 50% or more light transmission on a silicon wafer;

wherein at least one of the plurality of color filters has a first bandpass range, at least one of the plurality of color filters has a second bandpass range that is different from the first bandpass range, and at least one of the plurality of color filters has a third bandpass range that is different from the first bandpass range and the second bandpass range; and wherein each of the plurality of color filters includes a first material having a first refractive index (np or nq) surrounded by a second material having a second refractive index (nq or np) that is different from the first refractive index, and wherein the combined refractive index of the first and second materials differs from the first and second refractive indices and matches a respective one of the bandpass ranges, and wherein the first material is a cavity including a metal material therein.

6. The method of fabricating the multipixel image sensor of claim 5, wherein the step of forming the plurality of color filters comprises forming equivalent index filters.

7. The method of fabricating the multipixel image sensor of claim 5, wherein the step of forming the plurality of color filters comprises forming multicavity filters.

8. The method of fabricating the multipixel image sensor of claim 5, wherein the step of forming the plurality of color filters comprises forming multispectral color filters.

* * * * *